United States Patent
Kado et al.

(10) Patent No.: US 6,890,849 B2
(45) Date of Patent: May 10, 2005

(54) INTERCONNECT, INTERCONNECT FORMING METHOD, THIN FILM TRANSISTOR, AND DISPLAY DEVICE

(75) Inventors: Masaki Kado, Yokohama (JP); Shigeru Aomori, Yokohama (JP); Yoshitaka Yamamoto, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 0 days.

(21) Appl. No.: 10/660,702

(22) Filed: Sep. 12, 2003

(65) Prior Publication Data

US 2004/0051180 A1 Mar. 18, 2004

(30) Foreign Application Priority Data

Sep. 17, 2002 (JP) ........................................ 2002-269661

(51) Int. Cl.⁷ .............................................. H01L 29/40
(52) U.S. Cl. ........................ 438/625; 438/653; 438/678
(58) Field of Search ................................. 438/618, 622, 438/625, 627, 643, 652, 653, 678

(56) References Cited

U.S. PATENT DOCUMENTS 6,181,012 B1    1/2001  Edelstein et al.
6,740,591 B1 *  5/2004  Miller et al. ................. 438/692

FOREIGN PATENT DOCUMENTS

| JP | 11-135504 | 5/1999 |
| JP | 11-238703 | 8/1999 |
| JP | 2001-189295 | 7/2001 |

* cited by examiner

*Primary Examiner*—Roy Potter
(74) *Attorney, Agent, or Firm*—Oblon, Spivak, McClelland, Maier & Neustadt, P.C.

(57) ABSTRACT

An interconnect forming method according to the present invention includes a step of forming a barrier film for metal diffusion on an insulator film, a step of selectively forming a metal seed layer on the barrier film for metal diffusion using an electroless plating process, a step of selectively forming a metal conductive layer on the metal seed layer using an electroplating process, and a step of etching the barrier film for metal diffusion using the metal conductive layer as a mask.

12 Claims, 8 Drawing Sheets

INTERCONNECT, INTERCONNECT FORMING METHOD, THIN FILM TRANSISTOR, AND DISPLAY DEVICE

CROSS-REFERENCE TO RELATED APPLICATIONS

This application is based upon and claims the benefit of priority from the prior Japanese Patent Application No. 2002-269661, filed Sep. 17, 2002, the entire contents of which are incorporated herein by reference.

BACKGROUND OF THE INVENTION

1. Field of the Invention

The present invention relates to an interconnect used in a display device represented by a liquid crystal display device, a semiconductor device represented by an ULSI, or the like. And the present invention relates to an interconnect forming technique, a thin film transistor comprising interconnect structures, and a display device comprising interconnects or thin film transistors.

2. Description of the Related Art

In recent years, as a material for interconnects used in the field of semiconductors represented by LSIs and ULSIs, efforts have been made to examine copper (Cu), which offers a lower interconnect resistance than conventional interconnects composed of aluminum (Al) and which has a higher tolerance to electro-migration, stress-migration, or the like. These efforts have been propelled by the development of finer-grained structures resulting from an increase in the degree of integration, an increase in operating speed, and the like.

Further, also in the field of display devices represented by liquid crystal display devices and the like, it has been desirable to increase a display area and thus an interconnect length and to integrate peripheral circuit portions into a monolithic integrated circuit by incorporating various additional functions such as a driver circuit and an intra-pixel memory. Thus, there has been a demand for interconnects offering a reduced resistance as in the case with the field of semiconductors.

Copper is expected to be an interconnect material of the next generation because it offers a lower resistance and a higher tolerance to migration than Al, a conventional interconnect material.

However, with a combination of masking based on photo-lithography, reactive ion etching, and the like, which combination has hitherto been used to form fine interconnects, it is difficult to form fine interconnects using Cu. This is because a halide of copper has a low evaporation pressure, i.e. it is difficult to evaporate. That is, if copper is used to form a fine interconnect, an etching process must be executed at a temperature of 200 to 300° C. in order to volatilize and remove the halide formed by the etching. It has thus been difficult to form a fine copper interconnect on the basis of etching.

A forming method for a fine interconnect using copper is what is called a "damascene process" disclosed in, for example, Jpn. Pat. Appln. KOKAI Publication No. 2001-189295 and Jpn. Pat. Appln. KOKAI Publication No. 11-135504. With this method, first, a trench with a desired interconnect pattern shape is formed in an insulator film on a substrate. A thin copper film is formed all over the insulator film and inside the interconnect trench so as to fill up the interconnect trench, using various methods including PVD (Physical Vapor Deposition) such as a sputtering process, a plating process, and CVD (Chemical Vapor Deposition) using an organic metal material. Subsequently, a polishing process such as CMP (Chemical Mechanical Polishing), etch-back, or the like is used to remove the thin copper film from the upper end surface of the filled-up trench. Thus, a filled-up copper interconnect pattern is formed with the thin copper film remaining only inside the trench.

Description will be given of a forming method for an interconnect using the above described damascene process. FIGS. 12A to 12E are sectional views showing an example of the steps of a forming method for an interconnect using the conventional damascene process.

First, an insulator film 132 is formed on a substrate 131 composed of glass or the like. A polishing stop film 133 is then formed on the insulator film 132. A photo resist film (photosensitive resin film) 134 is then formed on the polishing stop film 133. Subsequently, a PEP (Photo Engraving Process, i.e. what is called "photo-lithography") is utilized to form a trench (opening) 135 in the photo resist film 134 which is shaped so as to correspond to an area in which an interconnect is to be formed (see FIG. 12A).

Then, the photo resist film 134 is used as a mask to etch the polishing stop film 133 and the insulator film 132 to form a trench 136 shaped so as to correspond to an area in which an interconnect is to be formed (see FIG. 12B).

Then, a barrier film for copper diffusion 137 and a copper seed layer 138 are formed on the insulator film 132 and polishing stop film 133, in which the trench 136 has been formed (see FIG. 12C). Reference numeral 139 in FIG. 12C denotes a trench resulting from the formation of the barrier film for copper diffusion 137 and the copper seed layer 138.

Then, one of the above various methods is used to form a copper conductive layer 140 on the copper seed layer 138 (see FIG. 12D).

Then, the CMP process is used to remove the copper conductive layer 140, copper seed layer 138, barrier film for copper diffusion 137 from the polishing stop film 133 until the polishing stop film 133 is exposed. Thus, a buried copper interconnect pattern is formed with the copper conductive layer remaining only inside the trench (see FIG. 12E).

However, the above various conventional methods have the problems described below.

First, the damascene process, which has been actively examined for LSIs, ULSIs, and the like, requires a insulator film forming step, a photo-lithography step, an etching step, and a step of forming a polishing stop film to form a trench in which an interconnect is to be buried, and a via that connects and an upper and lower electrodes together. So, formation process is complicated, and manufacturing cost becomes high.

Further, the thickness of a conductive layer must be increased in order to reduce the interconnect resistance. However, the use of a trench or a via hole with a high aspect ratio prevents copper from being properly buried.

Furthermore, there is disadvantageously a decrease in the throughput of the CMP process or another process for removing unwanted parts after forming a thin copper film all over the substrate.

Moreover, a large-sized CMP apparatus has been developed for a wafer of diameter about 12 inches on which an LSI or a ULSI is produced. However, display devices represented by liquid crystal display devices require a polishing process that can accurately achieve flatness over a larger area than LSIs. Thus, it is difficult to put this apparatus to practical use in applying the apparatus to display devices represented by liquid crystal display devices.

Moreover, in the case of such a large substrate as used in a liquid crystal display device, the area of a thin copper film part used as an interconnect is very small compared to the area of the glass substrate. Thus, even if it is possible to polish all the surface by the CMP or achieve removal by etching, most of the thin copper film formed is removed and discarded. As a result, copper, which is an expensive material, is very inefficiently used. This results in problems such as an increase in product price.

BRIEF SUMMARY OF THE INVENTION

According to an aspect of the present invention, there is provided an interconnect forming method comprising a step of forming a barrier film for metal diffusion on an insulator film, a step of selectively forming a metal seed layer on the barrier film for metal diffusion using an electroless plating process, a step of selectively forming a metal conductive layer on the metal seed layer using an electroplating process, and a step of etching the barrier film for metal diffusion using the metal conductive layer as a mask.

According to the interconnect forming method of the present invention, the metal seed layer is selectively formed on the barrier film for metal diffusion by the electroless plating process. Accordingly, the metal conductive layer can be selectively formed on the metal seed layer by the electroplating process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the embodiments given below, serve to explain the principles of the invention.

DETAILED DESCRIPTION OF THE INVENTION

Figure 1:
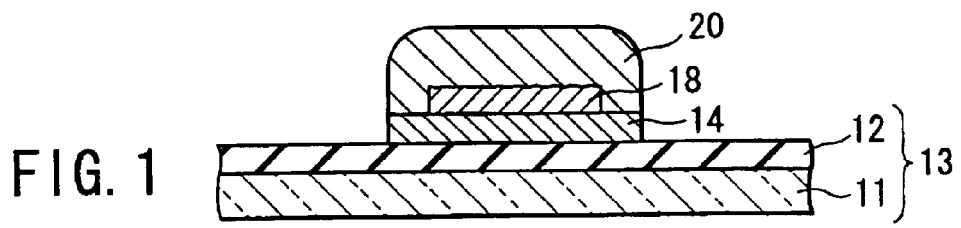
FIG. 1 is a sectional view showing the structure of an interconnect according to Embodiment 1 of the present invention.

Embodiments of the present invention will be described below in detail with reference to the drawings. In the drawings described below, elements having the same functions are denoted by the same reference numerals. Their repeated descriptions are omitted.

Embodiment 1

Embodiment 1 of the present invention will be described below with reference to FIGS. 1, 4A to 4F, and 5.

FIGS. 4A to 4F are sectional views showing the steps of an interconnect forming method according to Embodiment 1 of the present invention.

Embodiment 1 relates to an interconnect composed of a barrier film for copper diffusion, a copper seed layer, and a copper interconnect layer (copper conductive layer), and a forming method for the interconnect selectively formed on a base by combining an electroless plating process and an electroplating process.

First, PE-CVD (Plasma-Enhanced Chemical Vapor Deposition) is used to deposit a silicon oxide film ($SiO_2$ film) as an underlying insulator film 12 on (the top surface of) a substrate 11 composed of glass or the like. Subsequently, a tantalum nitride film (TaN film) as a barrier film for copper diffusion 14 is formed using a sputtering process (see FIG. 4A). This can be accomplished by using tantalum as a target while allowing 7 sccm of argon gas and 3 sccm of nitrogen gas to flow as a sputtering gas. Alternatively, as the barrier film for copper diffusion 14, a tantalum film (Ta film) may be formed instead of the tantalum nitride film by the sputtering process. This can be accomplished by using tantalum as a target while allowing 10 sccm of argon gas to flow as a sputtering gas. Furthermore, as the barrier film for copper diffusion 14, a TiN film, a TaSiN film, a WSiN film, or the like is available. In Embodiment 1, an insulator base 13 is composed of the combination of the insulator substrate 11, composed of glass or the like, and the underlying insulator film 12. That is, the insulator base 13 has the substrate 11 and the underlying insulator film 12, provided on the substrate 11.

The insulator base 13 is not limited to one having an insulator substrate 11 and an underlying insulator film 12 provided on the substrate 11. The insulator base 13 has only to be such that an area in which an interconnect is to be provided is insulating. Accordingly, the insulator base 13 may have, for example, a conductive substrate and an underlying insulator film 12 provided on the conductive substrate.

Figure 12A:
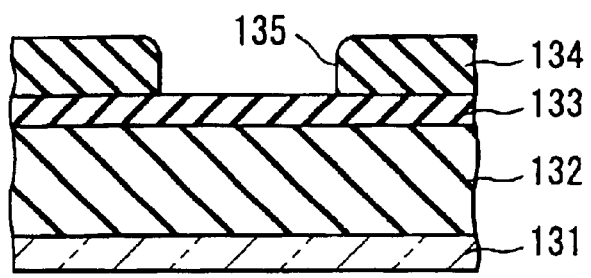
FIGS. 12A to 12E are sectional views showing the steps of an interconnect forming method using a conventional damascene process.
Figure 12B:
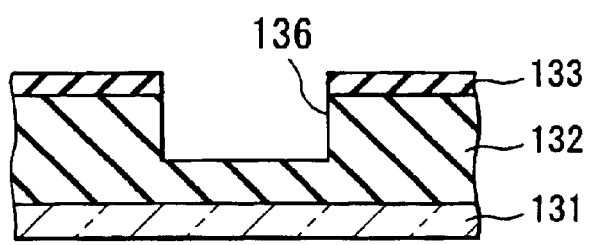
Figure 12C:
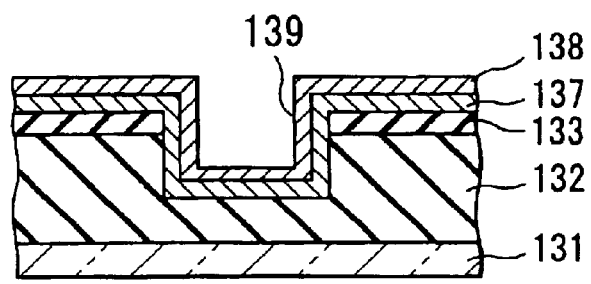
Figure 12D:
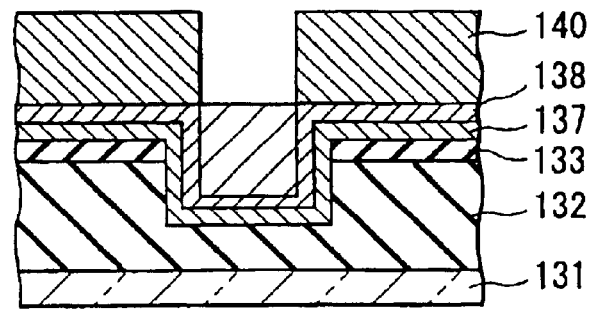
Figure 12E:
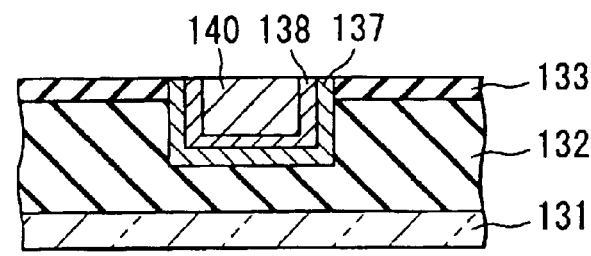

As described previously, the conventional damascene process, used to form a copper interconnect, requires a step of forming a polishing stop film (133 in FIG. 12A) for CMP (Chemical Mechanical Polishing) and an etching step of forming a trench in which an interconnect is to be buried (136 in FIG. 12B), both steps being executed before a barrier film for copper diffusion is formed. However, Embodiment 1 does not require these steps. Consequently, Embodiment 1 enables a reduction in the number of steps and thus in manufacturing costs.

Then, to remove organic substances and particles from the surface of the barrier film for copper diffusion 14, the insulator base 13 on which the barrier film for copper diffusion 14 is subjected to ultrasonic cleaning using acetone. Subsequently, to remove a surface oxide from the barrier film for copper diffusion 14, the insulator base 13 on which the copper diffusion insulator film 14 is formed is cleaned using a hydrofluoric acid solution of concentration 5%. Then, the PEP (Photo Engraving Process, i.e. what is called "photo-lithography") is utilized to pattern a photo resist film (a photosensitive resin film) 15 on the insulator base 13 on which the barrier film for copper diffusion 14 is formed and only in an area in which an interconnect is not to be formed. Specifically, the photo resist film 15 is formed on (a top surface 14a of) the barrier film for copper diffusion 14. Then, the PEP is used to form a trench in the photo resist film 15 which is shaped so as to correspond to an area in which an interconnect is to be formed, i.e. the trench 16 shaped so as to correspond to an area in which a copper seed layer 18 is to be formed (see FIG. 4B).

Then, a substrate 17 (see FIG. 4B) is immersed in a stannous chloride solution to attach stannous ions ($Sn^{2+}$) to the exposed surface (exposed area of the top surface 14a) of the barrier film for copper diffusion 14. Subsequently, the substrate 17 is immersed in a palladium chloride solution to precipitate Pd on the exposed barrier film for copper diffusion 14, the Pb acting as a catalyst for an electroless copper plating reaction. At this time, the following redox reaction occurs on the surface of the substrate 17:

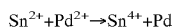

$$Sn^{2+} + Pd^{2+} \rightarrow Sn^{4+} + Pd$$

Then, to remove the $Sn^{2+}$ and $Sn^{4+}$ remaining on the surface of the barrier film for copper diffusion 14, the substrate 17 is cleaned using sulfuric acid. Subsequently, the substrate 17 is immersed in an electroless copper plating solution to selectively form the copper seed layer 18, composed of copper, only in an area from which the barrier film for copper diffusion 14 is exposed (see FIG. 4C).

Then, the substrate 17 on which the copper seed layer 18 is formed is cleaned using pure water and then dried. Subsequently, an organic solution is used to remove the photo resist film 15 from the substrate 17 on which the copper seed layer 18 is formed (see FIG. 4D). The substrate 17 on which the copper seed layer 18 is formed is annealed in a vacuum at 400° C. for 10 minutes.

The annealing treatment increases the grain size in the copper seed layer 18 and surface roughness (concaves and convexes), while reducing resistivity and film stress.

Figure 5:
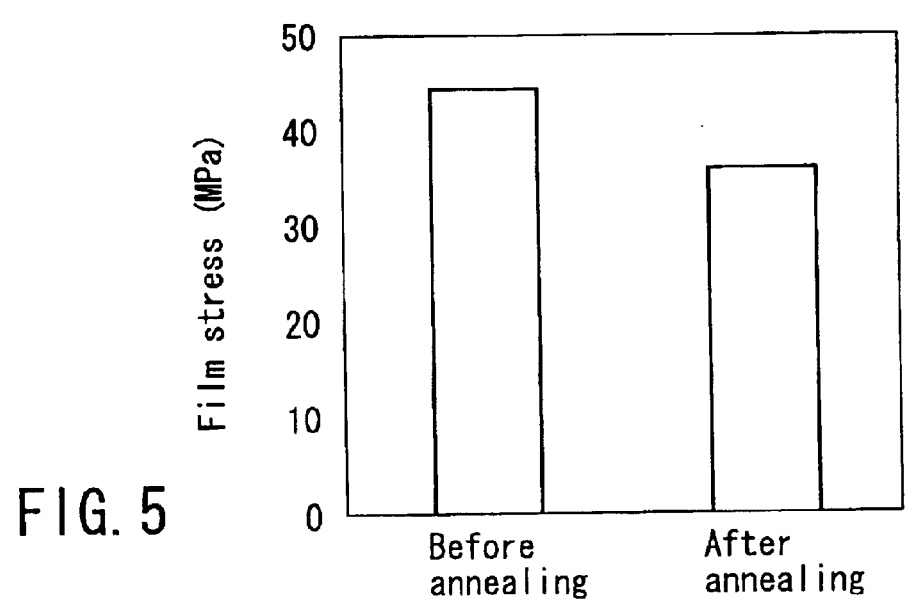
FIG. 5 is a graph showing a variation in film stress occurring in a copper seed layer which variation is caused by annealing.

FIG. 5 shows a variation in film stress occurring in the copper seed layer 18 which variation is caused by the annealing.

The film stress of a thin film formed on the seed layer by the electroplating process reflects the film stress of the underlying seed layer. Thus, by reducing the film stress of the copper seed layer 18, the film stress of the copper conductive layer 20 is reduced, the copper conductive layer 20 being formed on the copper seed layer 18 by the electroplating process. This makes it possible to suppress the peeling of a copper conductive layer 20 from the barrier film for copper diffusion 14, which peeling may occur while a copper conductive layer 20 is being formed.

To remove a surface oxide from the annealed substrate 19, the substrate 19 is cleaned using a hydrofluoric acid solution of concentration 5%. Subsequently, an electroplating process is executed by using the substrate 19 as a cathode, while installing a platinum electrode at an anode position in an electroplating bath, and then using a constant current equipment to flow a current between the electrodes in a copper sulfate solution. This electroplating process forms a copper conductive layer 20 on the surface of the copper seed layer 18 (see FIG. 4E). In the electroplating process, the presence of the copper seed layer 18 is essential in causing copper to precipitate on the cathode. Thus, the copper conductive layer 20 is not deposited on (the top surface 14a of) the barrier film for copper diffusion 14. Therefore, the copper conductive layer 20 can be selectively formed on the copper seed layer 18 (on a top surface 18a and a peripheral surface 18b of the copper seed layer 18). Thus, in Embodiment 1, an interconnect can be selectively formed on the base 13 without using the CMP. Further, the interconnect material is not removed or discarded. This saves the interconnect material.

After the electroplating process, the substrate 19 on which the copper conductive layer 20 is formed is cleaned using pure water and then dried. Subsequently, the copper conductive layer 20 is used as a mask to etch the barrier film for copper diffusion 14 by RIE (Reactive Ion Etching) to remove the copper diffusion film 14 from the areas other than the interconnect part (see FIG. 4F).

Thus, an interconnect is completed using copper as a conductive layer material. Its structure is characterized in that the copper conductive layer 20 surrounds the top and sides of the copper seed layer 18, that copper is not deposited on the sides of the barrier film for copper diffusion 14, and that the sides of the copper conductive layer 20 are aligned with the corresponding sides of the barrier film for copper diffusion 14, as shown in FIG. 4F. That is, the barrier film for copper diffusion 14 as a barrier film for metal diffusion has an externally exposed peripheral surface 14b. The copper seed layer 18 as a metal seed layer has the top surface 18a and the peripheral surface 18b. The copper conductive layer 20 as a metal conductive layer has a peripheral surface 20b flush with the peripheral surface 14b of the barrier film for copper diffusion 14. The copper conductive layer 20 surrounds the top surface 18a and peripheral surface 18b of the copper seed layer 18.

Thus, in Embodiment 1, an interconnect can be formed using copper as a conductive layer material and without using the CMP (Chemical Mechanical Polishing). Accordingly, Embodiment 1 is applicable to a base which is large in area and which is difficult to subject to the CMP.

The example of the thickness of each film in the interconnect formed as an interconnect for a switching circuit and a logic circuit of a liquid crystal display (LCD) is shown below. The insulator film 12 has a thickness of 400 nm, and the barrier film for copper diffusion 14 has a thickness of 50 nm. The copper seed layer 18, formed by the electroless plating process, has a thickness of 50 nm. The copper conductive layer 20, formed by the electroplating process, has a thickness of 400 nm.

FIG. 1 is a sectional view showing the structure of the interconnect according to Embodiment 1 (the same interconnect as that in FIG. 4F).

The interconnect according to Embodiment 1 is provided on the insulator base 13 instead of being buried in the base 13 (without forming any trenches), and has a three-layer structure composed of the barrier film for copper diffusion 14 as a barrier film for metal diffusion, which is provided on the insulator base 13, the copper seed layer 18 as a metal seed layer, which is provided on the barrier film for copper diffusion 14, and the copper conductive layer 20 as a metal conductive layer, which is provided on the copper seed layer 18.

Further, the interconnect is characterized in that the copper conductive layer 20 surrounds the top and sides of the copper seed layer 18, that the copper conductive layer 20 is not formed on the sides of the barrier film for copper diffusion 14, and that the sides of the copper conductive layer 20 are aligned with the corresponding sides of the barrier film for copper diffusion 14. Specifically, the barrier film for copper diffusion 14 as a barrier film for metal diffusion has the externally exposed peripheral surface 14b. The copper seed layer 18 as a metal seed layer has the top surface 18a and the peripheral surface 18b. The copper conductive layer 20 as a metal conductive layer conductive layer has a peripheral portion formed on the peripheral surface 18b of the copper seed layer 18 and has the peripheral surface 20b, which is flush with the peripheral surface 14b of the barrier film for copper diffusion 14. The copper conductive layer 20 surrounds the top surface 18a and peripheral surface 18b of the copper seed layer 18.

Further, the interconnect forming method according to Embodiment 1 comprises a step of forming the barrier film for copper diffusion 14 on the insulator base 13, a step of selectively forming of the copper seed layer 18 on (the top surface 14a of) the barrier film for copper diffusion 14 using the electroless plating process, a step of selectively forming of the copper conductive layer 20 on (the top surface 18a and peripheral surface 18b of) the copper seed layer 18 using the electroplating process, and a step of etching the barrier film for copper diffusion 14 using the copper conductive layer 20 as a mask. The method further comprises a step of annealing after the copper seed layer 18 has been formed, to reduce the film stress of the copper seed layer 18. Further, the step of selectively forming of the copper seed layer 18 on the barrier film for copper diffusion 14 using the electroless plating process uses a mask composed of a photosensitive resin and having a trench 16 shaped so as to correspond to an area in which the copper seed layer 18 is formed, to execute the electroless plating process to form the copper seed layer 18 on (the top surface 14a of) the barrier film for copper diffusion 14 exposed from the trench 16.

According to the interconnect forming method according to Embodiment 1, the combination of the electroless plating process and the electroplating process enables an interconnect to be selectively formed without using the CMP as in the conventional damascene process. Further, an interconnect composed of copper, that is a low resistance interconnect material, can be selectively formed even on a base of such a size as makes it difficult to carry out the CMP. Furthermore, an interconnect can be selectively formed on the base without using the CMP. That is, the interconnect material is not removed or discarded and can thus be saved. Further, Embodiment 1 eliminates the need for a step of forming a polishing stop film for the CMP and a step of forming a trench in which an interconnect is to be buried. This reduces the number of manufacturing steps and thus manufacturing costs.

Embodiment 2

Embodiment 2 of the present invention will be described below with reference to FIGS. 3, 6A to 6F.

FIGS. 6A to 6F are sectional views showing the steps of an interconnect forming method according to Embodiment 2 of the present invention.

Embodiment 2 also relates to a forming method for an interconnect composed of a barrier film for copper diffusion, a copper seed layer, and a copper conductive layer selectively formed on a base by combining an electroless plating process and an electroplating process.

Figure 4A:
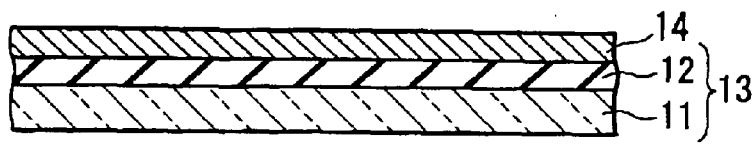
FIGS. 4A to 4F are sectional views showing the steps of an interconnect forming method according to Embodiment 1 of the present invention.
Figure 4B:
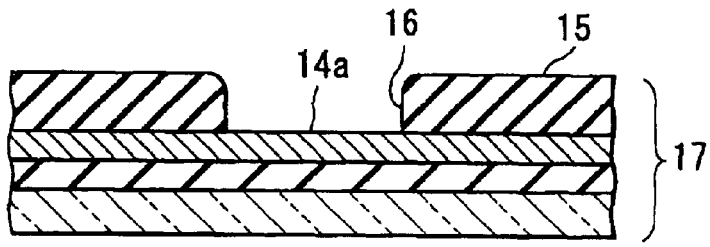
Figure 4C:
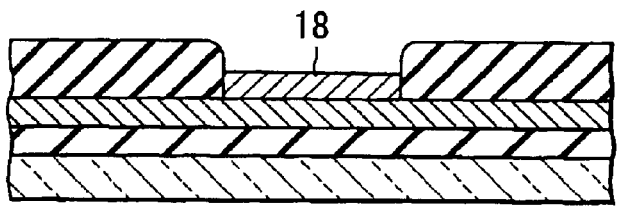
Figure 4D:
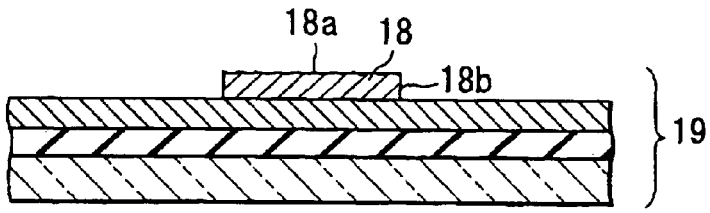
Figure 4E:
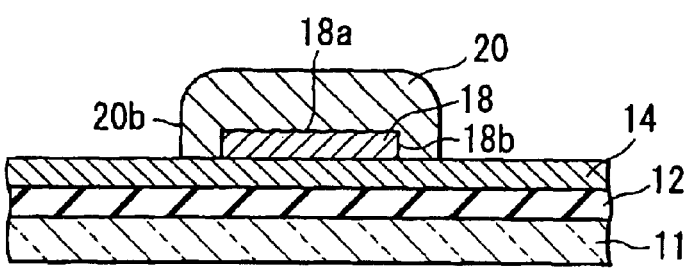
Figure 4F:
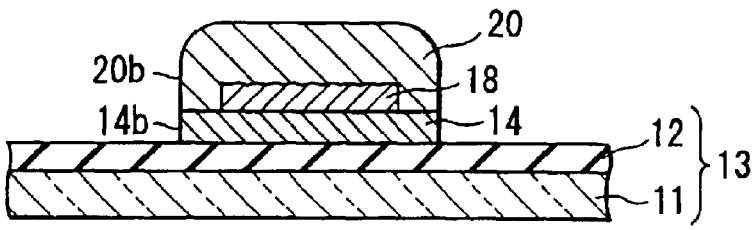

FIGS. 6A to 6D for Embodiment 2 show exactly the same steps as those starting with the formation of the underlying insulator film 12 and barrier film for copper diffusion 14 on the substrate 11, shown in FIG. 4A for Embodiment 1, described above, and ending with the formation and annealing of the copper seed layer 18, shown in FIG. 4D. Accordingly, the description of these steps is omitted.

Figure 6A:
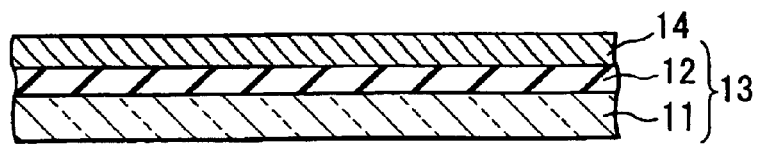
FIGS. 6A to 6F are sectional views showing the steps of an interconnect forming method according to Embodiment 2 of the present invention.
Figure 6B:
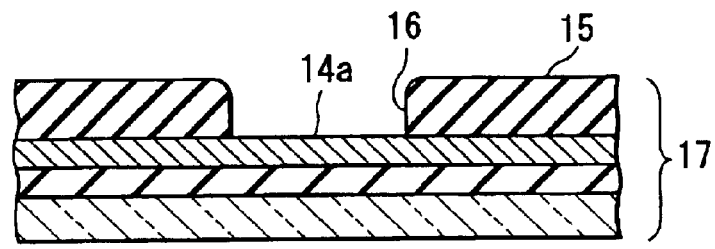
Figure 6C:
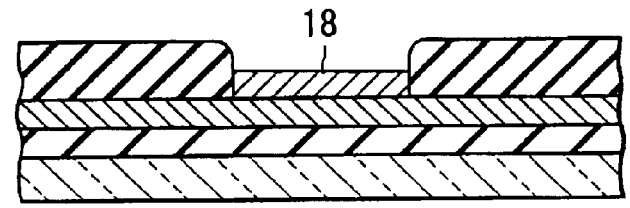
Figure 6D:
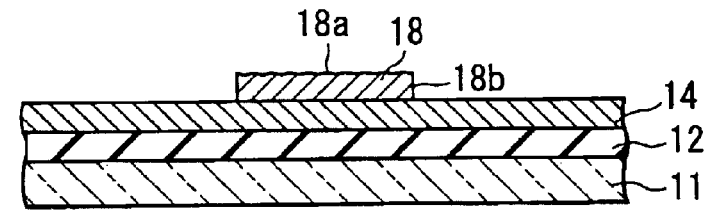
Figure 6E:
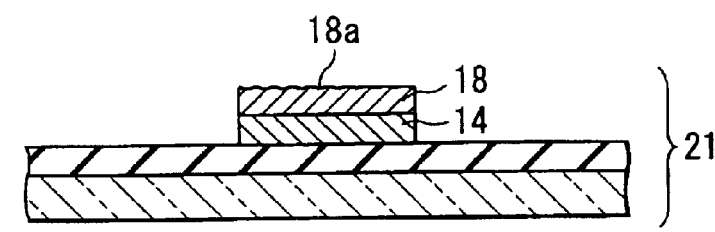

As shown in FIG. 6D, the copper seed layer 18 is formed and annealed. Then, the copper seed layer 18 is used as a mask to etch the barrier film for copper diffusion 14 by the RIE process. Thus, the barrier film for copper diffusion 14 is removed from the areas other than the interconnect part (see FIG. 6E).

To remove a surface oxide from an etched substrate 21, the substrate 21 is cleaned using a hydrofluoric acid solution of concentration 5%. Subsequently, the electroplating process is executed by using the substrate 21 as a cathode, while installing a platinum electrode at an anode position in an electroplating bath, and then using a constant current equipment to flow a current between the electrodes in a copper sulfate solution. This electroplating process forms the copper conductive layer 20 on the surface of the copper seed layer 18 (see FIG. 6F). In the electroplating process, the presence of the copper seed layer 18 is essential in causing copper to precipitate on the cathode. Thus, the copper conductive layer 20 is not deposited on the underlying insulator film 12 or (peripheral surface 14b of) the barrier film for copper diffusion 14. So, the copper conductive layer 20 can be selectively formed on (a top surface 18a and a peripheral surface 18b of) the copper seed layer 18. Thus, in Embodiment 2, an interconnect can be selectively formed on the base 13. Further, the interconnect material is not removed or discarded. This saves the interconnect material. After the electroplating process, the substrate 21 on which the copper conductive layer 20 is formed is cleaned using pure water and then dried.

Figure 6F:
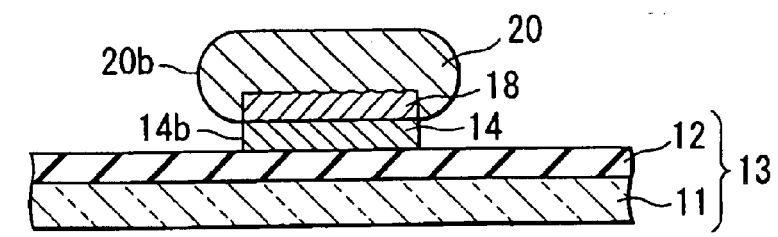

Thus, an interconnect is completed using copper as an conductive layer material. Its structure is characterized in that the copper conductive layer 20 surrounds the top and sides of the copper seed layer 18, that copper is not deposited on the sides of the barrier film for copper diffusion 14, and that the sides of the copper conductive layer 20 project from the corresponding sides of the barrier film for copper diffusion 14, as shown in FIG. 6F. That is, the barrier film for copper diffusion 14 as a barrier film for metal diffusion has the externally exposed peripheral surface 14b. The copper seed layer 18 as a metal seed layer has the top surface 18a and the peripheral surface 18b. The copper conductive layer 20 as a metal conductive layer has the peripheral surface 20b projecting outward from the peripheral surface 14b of the barrier film for copper diffusion 14. The copper conductive layer 20 surrounds the top surface 18a and peripheral surface 18b of the copper seed layer 18.

Thus, also in Embodiment 2, an interconnect can be formed using copper as an interconnect layer material and without using the CMP (Chemical Mechanical Polishing). Accordingly, Embodiment 2 is applicable to a base which is large in area and which is difficult to subject to the CMP.

The example of the thickness of each film in the interconnect formed as an interconnect for a switching circuit and a logic circuit of a liquid crystal display (LCD) is shown below. The insulator film 12 has a thickness of 400 nm, and the barrier film for copper diffusion 14 has a thickness of 50 nm. The copper seed layer 18, formed by the electroless plating process, has a thickness of 50 nm. The copper conductive layer 20, formed by the electroplating process, has a thickness of 400 nm.

Figure 2:
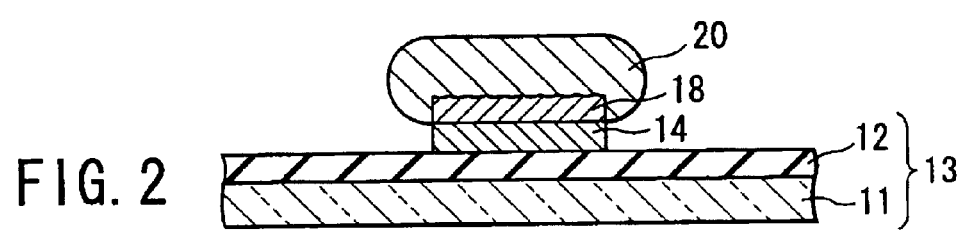
FIG. 2 is a sectional view showing the structure of an interconnect according to Embodiment 2 of the present invention.

FIG. 2 is a sectional view showing the structure of the interconnect according to Embodiment 2 (the same interconnect as that in FIG. 6F).

The interconnect according to Embodiment 2 is characterized in that the copper conductive layer 20 surrounds the top and sides of the copper seed layer 18, that the copper conductive layer 20 is not formed on the sides of the barrier film for copper diffusion 14, and that the sides of the copper conductive layer 20 project from the corresponding sides of the barrier film for copper diffusion 14, as shown in FIG. 2. Specifically, the barrier film for copper diffusion 14 as a barrier film for metal diffusion has the externally exposed peripheral surface 14b. The copper seed layer 18 as a metal seed layer has the top surface 18a and the peripheral surface 18b. The copper conductive layer 20 as a metal conductive layer has the peripheral surface 20b, which projects outward from the peripheral surface 14b of the barrier film for copper diffusion 14. The copper conductive layer 20 surrounds the top surface 18a and peripheral surface 18b of the copper seed layer 18.

Further, the interconnect forming method according to Embodiment 2 comprises a step of forming the barrier film for copper diffusion 14 on the insulator base 13, a step of selectively forming the copper seed layer 18 on (the top surface 14a of) the barrier film for copper diffusion 14 using the electroless plating process, a step of etching the barrier film for copper diffusion 14 using the copper seed layer 18 as a mask and a step of selectively forming a metal conductive layer on (the top surface 18a and peripheral surface 18b of) the copper seed layer 18 using the electroplating process. The method further comprises a step of annealing after the copper seed layer 18 has been formed, to reduce the film stress of the copper seed layer 18. Further, the step of selectively forming the copper seed layer 18 on the barrier film for copper diffusion 14 using the electroless plating process uses a mask composed of a photosensitive resin and having the trench 16 shaped so as to correspond to an area in which the copper seed layer 18 is formed, to execute the electroless plating process to form the copper seed layer 18 on (the top surface 14a of) the barrier film for copper diffusion 14 exposed from the trench 16.

Embodiment 3

Embodiment 3 of the present invention will be described below with reference to FIGS. 3 and 7A to 7D.

FIGS. 7A to 7D are sectional views showing the steps of an interconnect forming method according to Embodiment 3 of the present invention.

Embodiment 3 also relates to a forming method for an interconnect composed of a barrier film for copper diffusion, a copper seed layer, and a copper conductive layer selectively formed on a base by combining an electroless plating process and an electroplating process.

Embodiment 3 includes exactly the same steps as those starting with the formation of the underlying insulator film 12 and barrier film for copper diffusion 14 on the substrate 11, shown in FIG. 6A for Embodiment 2, described above, and ending with the formation the copper seed layer 18, shown in FIG. 6C. Accordingly, the description of these steps is omitted.

Figure 7A:
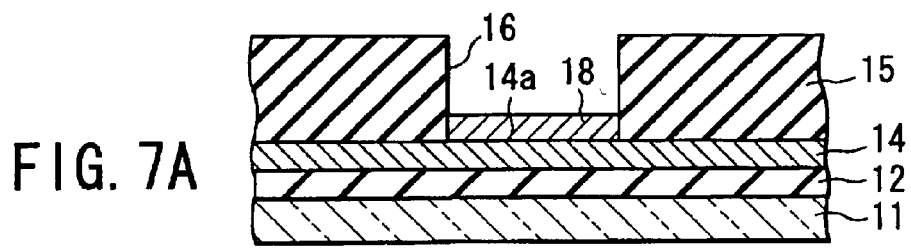
FIGS. 7A to 7D are sectional views showing the steps of an interconnect forming method according to Embodiment 3 of the present invention.
Figure 7B:
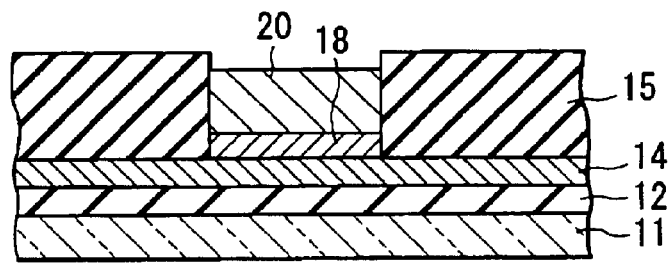
Figure 7C:
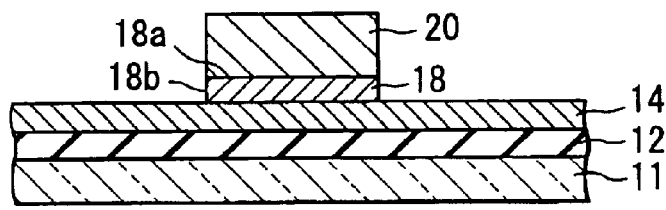

As shown in FIG. 7A, the copper seed layer 18 is formed. Then, to remove a surface oxide from a substrate on which the copper seed layer 18, the substrate is cleaned using a hydrofluoric acid solution of concentration 5%. Subsequently, the electroplating process is executed by using the substrate as a cathode, while installing a platinum electrode at an anode position in an electroplating bath, and then using a constant current equipment to flow a current between the electrodes in a copper sulfate solution. This electroplating process forms the copper conductive layer 20 on the surface of the copper seed layer 18 (see FIG. 7B). In the electroplating process, the presence of the copper seed layer 18 is essential in causing copper to precipitate on the cathode. Thus, the copper conductive layer 20 is not deposited on (the top surface of) the photo resist film 15. So, the copper conductive layer 20 can be selectively formed on (on a top surface 18a of) the copper seed layer 18. Thus, in Embodiment 3, an interconnect can be selectively formed on the base 13. Further, the interconnect material is not removed or discarded. This saves the interconnect material. After the electroplating process, the substrate on which the copper seed layer 18 and the copper conductive layer 20 is formed is cleaned using pure water and then dried. Subsequently, the photo resist film 15 is removed (see FIG. 7C). Then, the copper conductive layer 20 is used as a mask to etch the barrier film for copper diffusion 14 by the RIE process. Thus, the copper diffusion film 14 is removed from the areas other than the interconnect part (see FIG. 7D).

Figure 7D:
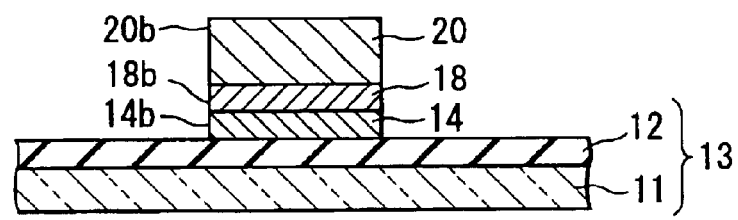

Thus, an interconnect is completed using copper as an conductive layer material. Its structure is characterized in that the copper conductive layer 20 is deposited on the top of the copper seed layer 18, that copper is not deposited on the sides of the barrier film for copper diffusion 14, and that the sides of the copper conductive layer 20, the copper seed layer 18, and that the barrier film for copper diffusion 14 are perpendicular to the substrate 11 and are aligned with one another, as shown in FIG. 7D. Thus, the barrier film for copper diffusion 14 as a barrier film for metal diffusion has the top surface 14a and the externally exposed peripheral surface 14b. The copper seed layer 18 as a metal seed layer has the top surface 18a and the externally exposed peripheral surface 18b and is deposited on the top surface 14a of the barrier film for copper diffusion 14. The copper conductive layer 20 as a metal conductive layer has the externally exposed top surface 20a and peripheral surface 20b and is deposited on the top surface 18a of the copper seed layer 18. The peripheral surface 20b of the copper conductive layer 20, the peripheral surface 18b of the copper seed layer 18, and the peripheral surface 14b of the barrier film for copper diffusion 14 are flushed with one another. Since the peripheral surface of the interconnect is thus perpendicular to the substrate, the line width of the interconnect can be easily controlled. Therefore, the interconnect according to Embodiment 3 is advantageous in producing a fine pattern.

Thus, also in Embodiment 3, an interconnect can be formed using copper as an interconnect layer material and without using the CMP (Chemical Mechanical Polishing). Accordingly, Embodiment 3 is applicable to a base which is large in area and which is difficult to subject to the CMP.

The example of the thickness of each film in the interconnect formed as an interconnect for a switching circuit and a logic circuit of a liquid crystal display (LCD) is shown below. The insulator film 12 has a thickness of 400 nm, and the barrier film for copper diffusion 14 has a thickness of 50 nm. The copper seed layer 18, formed by the electroless plating process, has a thickness of 100 nm. The copper conductive layer 20, formed by the electroplating process, has a thickness of 400 nm.

Figure 3:
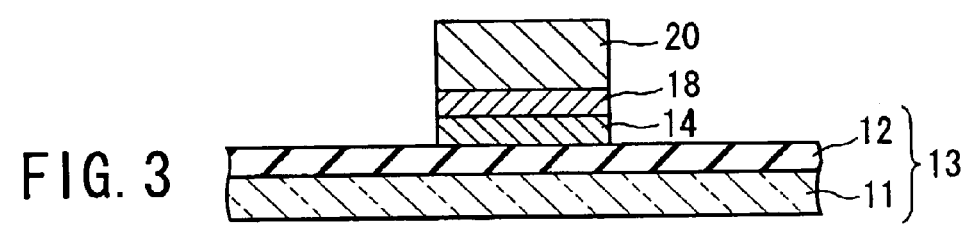
FIG. 3 is a sectional view showing the structure of an interconnect according to Embodiment 3 of the present invention.

FIG. 3 is a sectional view showing the structure of the interconnect according to Embodiment 3 (the same interconnect as that in FIG. 7D).

The interconnect according to Embodiment 3 is characterized in that the copper conductive layer 20 is deposited on the copper seed layer 18, that copper is not deposited on the sides of the barrier film for copper diffusion 14, and that the sides of the copper conductive layer 20, the copper seed layer 18, and the barrier film for copper diffusion 14 are aligned with one another, as shown in FIG. 3. Specifically, the barrier film for copper diffusion 14 as a barrier film for metal diffusion has the externally exposed peripheral surface 14b. The copper seed layer 18 as a metal seed layer has the top surface 18a and the externally exposed peripheral surface 18b. The copper conductive layer 20 has the externally exposed peripheral surface 20b and is deposited on the top surface 18a of the copper seed layer 18. The peripheral surface 20b of the copper conductive layer 20, the peripheral surface 18b of the copper seed layer 18, and the peripheral surface 14b of the barrier film for copper diffusion 14 are flushed with one another.

Further, the interconnect forming method according to Embodiment 3 comprises a step of forming the barrier film for copper diffusion 14 on the insulator base 13, a step of selectively forming the copper seed layer 18 on (the top surface 14a of) the barrier film for copper diffusion 14 using the electroless plating process, a step of selectively forming the copper conductive layer 20 on (the top surface 18a of) the copper seed layer 18 using the electroplating process, and a step of etching the barrier film for copper diffusion 14 using the copper conductive layer 20 as a mask. Further, the step of selectively forming the copper seed layer 18 on the barrier film for copper diffusion 14 using the electroless plating process uses a mask composed of a photosensitive resin and having the trench 16 shaped so as to correspond to an area in which the copper seed layer 18 is formed, to execute the electroless plating process to form the copper seed layer 18 on (the top surface 14a of) the barrier film for copper diffusion 14 exposed from the trench 16.

Embodiment 4

Figure 9:
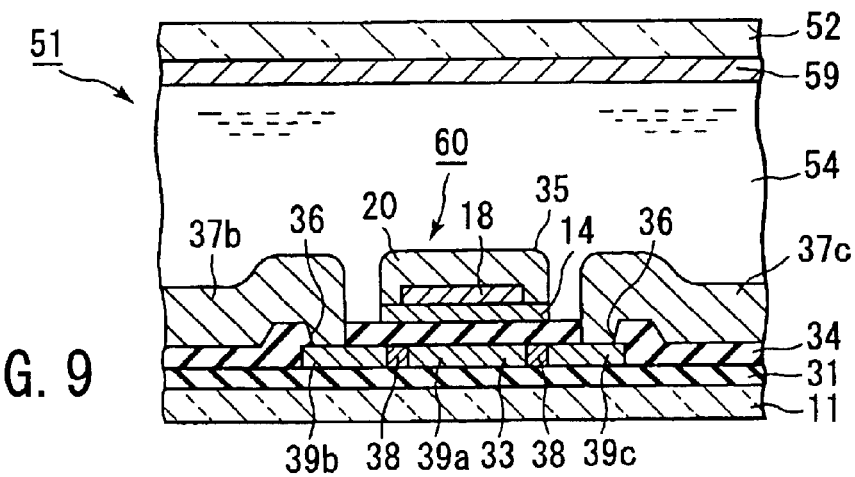
FIG. 9 is a sectional view showing the display device according to Embodiment 4 of the present invention.
Figure 8:
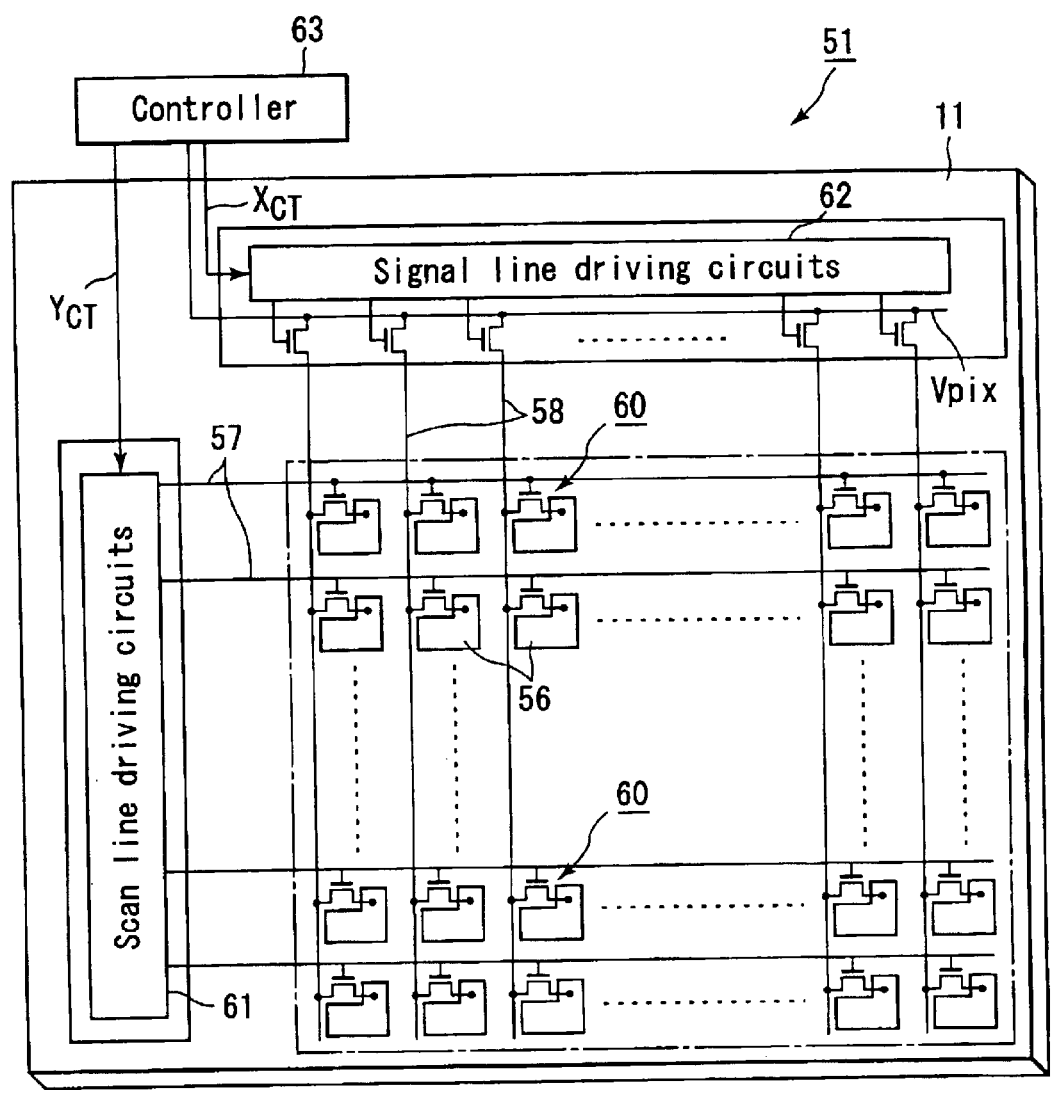
FIG. 8 is a plan view showing a display device according to Embodiment 4 of the present invention.

In Embodiment 4 of the present invention, description will be given of an example in which the present invention is applied to a liquid crystal display device as a display device. FIGS. 8 and 9 show a active matrix type liquid crystal display device 51 as a display device. The liquid crystal display device 51 comprises a pair of transparent substrates 52 and 11 as a pair of insulator substrates, a liquid crystal layer 54, an undercoat film 31, pixel electrodes 56, scan lines 57, signal lines 58, an opposite electrode 59, thin film transistors (hereinafter referred to as "TFTs") 60, scan line driving circuits 61, signal line driving circuits 62, a controller 63, and the like.

The pair of transparent substrates 52 and 11 may be composed of, for example, a pair of glass plates. The substrates 52 and 11 are joined together via a frame-shaped seal material (not shown). The liquid crystal layer 54 is provided between the pair of transparent substrates 52 and 11 and in an area surrounded by the seal material.

The following components are provided on the inner surface of one of the pair of transparent substrates 52 and 11, for example, the back (the bottom of FIG. 9) transparent substrate 11: the undercoat film 31, the plurality of pixel electrodes 56 arranged in matrix form in a row direction and a column direction, the plurality of TFT 60 electrically connected to the respective pixel electrodes 56, the scan lines 57 electrically connected to the plurality of TFTs 60, and the signal lines 58 electrically connected to the plurality of TFTs 60.

The undercoat film 31 may be composed of, for example, silicon nitride (SiNx). The pixel electrodes 56 are composed of, for example, ITOs. Each of the scan lines 57 is provided along the row direction (the lateral direction of FIG. 8) of the pixel electrodes 56. One end of each scan line 57 is electrically connected to the scan line driving circuit 61.

On the other hand, each of the signal lines 58 is provided along the column direction (the vertical direction of FIG. 8) of the pixel electrodes 56. One end of each signal line 58 is electrically connected to the signal line driving circuit 62.

The scan line driving circuits 61 and the signal line driving circuits 62 are each connected to the controller 63. The controller 63 receives, for example, externally supplied image and synchronizing signals to generate a pixel video signal Vpix, a vertical scan control signal $Y_{CT}$, and a horizontal scan control signal $X_{CT}$.

Each TFT 60 is composed of, for example, a MOS structure n type TFT (top gate type polysilicon TFT). The TFT 60 comprises a semiconductor layer 33, a gate insulator film 34, a gate electrode 35, a source electrode (not shown), a drain electrode (not shown), and the like.

Specifically, a semiconductor layer (polysilicon film) 33 is provided on the undercoat film 31 and has a channel area 39a and a source area 39b and a drain area 39c provided at the respective sides of the channel area 39a. The gate insulator film 34 is provided so as to cover the semiconductor layer 33 and the undercoat layer 31. The gate insulator film 34 may be composed of, for example, silicon oxide ($SiO_2$). The gate electrode 35 is provided on the gate insulator film 34 opposite the channel area 39a. An interlayer insulating layer may further be formed so as to cover the gate electrode 35 and the gate insulator film 34.

The gate insulator film 34 has contact holes 36 used to electrically connect interconnects 37b and 37c connected to a source electrode and a drain electrode, respectively, to a source area 39b and a drain area 39c, respectively, in the semiconductor area 33. The source electrode and the drain electrode can be formed integrally with the interconnects 37b and 37c, respectively, which are connected to the source and drain electrodes. A passivation film may further be formed so as to cover the source electrode, the drain electrode, and the interconnects 37b and 37c, connected to these electrodes, respectively.

The transparent opposite electrode 59 is a single layer provided opposite the plurality of pixel electrodes 56 and on the inner surface of the other transparent substrate, i.e. the front (the top of FIG. 9) transparent substrate 52. The opposite electrode 59 is composed of a transparent electrode such as an ITO. Further, color filters may be formed on the inner surface of the transparent substrate 52 in association with a plurality of pixel areas in which the respective pixel electrodes 56 are opposite the opposite electrode 59. Furthermore, a light blocking film may be formed on the inner surface of the transparent substrate 52 in association with areas between the pixel areas.

A polarizing plate (not shown) is provided outside each of the pair of transparent substrates 52 and 11. Further, if the liquid crystal display device 51 is of a transmission type, a surface light source (not shown) is provided behind the back transparent substrate 11. The liquid crystal display device 51 may be of a reflection type or a half-transmission and half-reflection type.

FIGS. 10A to 10F are sectional views showing a forming method for a MOS structure n type TFT 60 according to Embodiment 4 of the present invention.

Figure 10A:
FIGS. 10A to 10F are sectional views showing the steps of a forming method for a MOS structure n type TFT provided in a display device according to Embodiment 4 of the present invention.
Figure 10B:

First, the PE-CVD process is used to deposit the undercoat film 31 on the substrate 11, composed of glass or the like, the undercoat film 31 preventing the diffusion of impurities. Then, an amorphous silicon film 32 is deposited on the undercoat film 31 as an active layer. Then, the substrate on which the undercoat film 31 and the amorphous silicon film 32 is annealed at 500° C. to desorb hydrogen from the amorphous silicon film 32 (FIG. 10A).

Then, an ELA (Excimer Laser Anneal) process is used to recrystallize the amorphous silicon film 32 (see FIG. 10A) into the polysilicon film 33. Then, the PEP is used to coat resist on the polysilicon film 33. Then, the polysilicon film 33 is formed into an island shape using the CDE (Chemical Dry Anneal) process (see FIG. 10B). Subsequently, the gate insulator film 34 is formed using the PE-CVD process (see FIG. 10C). In Embodiment 4, the substrate 11, composed of glass or the like, the undercoat film 31, the semiconductor layer 33, and the gate insulator film 34 are combined into the insulator base 13. That is, the insulator base 13 has the insulator substrate 11, the undercoat film 31, the semiconductor layer 33, and the gate insulator film 34.

Figure 10C:
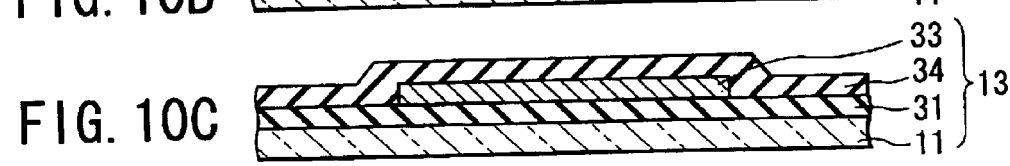
Figure 10D:
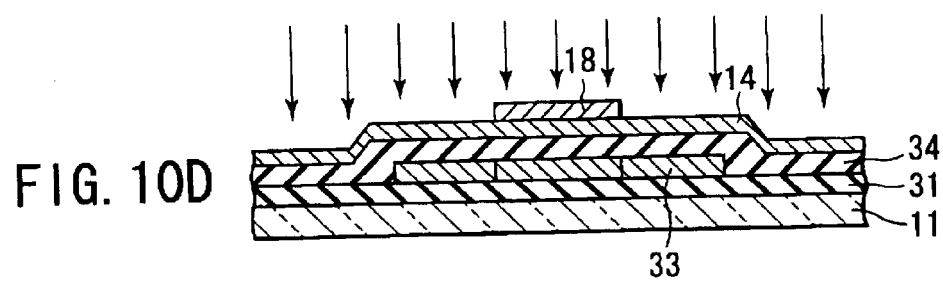

Subsequently, as shown in FIG. 10D, the barrier film for copper diffusion 14 is formed. Then, resist is coated on the barrier film for copper diffusion 14 using the PEP. The copper seed layer 18 is then selectively formed using the electroless plating process. The resist film is then removed. Subsequently, $PH_3$ is used as a doping gas to inject a low concentration of phosphorous as a donor into the polysilicon film 33 by an ion doping process (dose: $3.0 \times 10^{13}/cm^2$; acceleration voltage: 10 keV). At this time, the injected phosphorous is transmitted through the barrier film for copper diffusion 14 but not through the copper seed layer 18. Consequently, the phosphorous is not injected into that part of the polysilicon film 33 which is located immediately below the copper seed layer 18. The part into which the phosphorous is injected becomes a low-concentration impurity area (LDD (Lightly Doped Drain) area 38 (see FIG. 10E)).

Figure 10E:
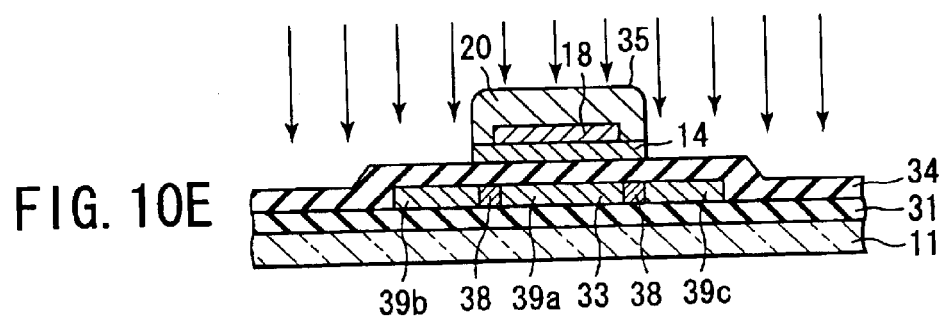
Figure 10F:
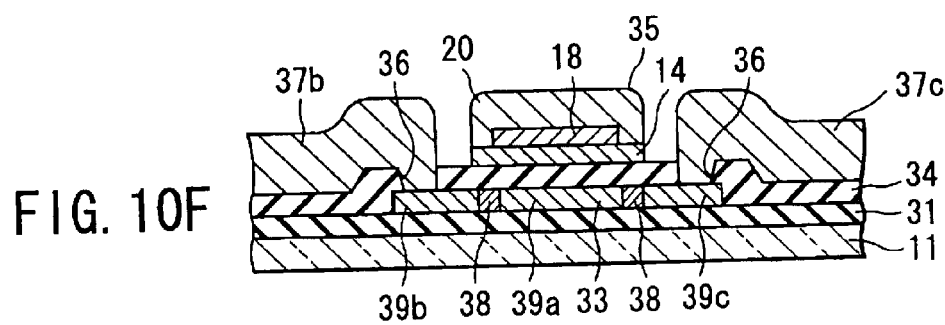

Subsequently, as shown in FIG. 10E, the copper conductive layer 20 is selectively formed on the copper seed layer 18 using the electroless plating process. Subsequently, the barrier film for copper diffusion 14 is etched using the copper conductive layer 20 as a mask. The gate electrode 35 is thus formed by the same method as that shown in Embodiment 1. This results in the gate electrode 35 as an interconnect structure having a three-layer structure composed of the barrier film for copper diffusion 14, the copper seed layer 18, and the copper conductive layer 20. The scan lines 57 may be formed integrally with the gate electrode 35 during its formation. Then, the scan lines 57 may also have a three-layer structure composed of the barrier film for copper diffusion 14, the copper seed layer 18, and the copper conductive layer 20.

Subsequently, $PH_3$ is used as a doping gas to inject a high concentration of phosphorous as a donor into the polysilicon film 33 by the ion doping process (dose: $2.5 \times 10^{15}/cm^2$; acceleration voltage: 70 keV). At this time, the phosphorous is not injected into that part of the polysilicon film 33 which is located immediately below the copper conductive layer 20. Further, the remaining part become a high concentration impurity area (the source area 39b and the drain area 39c) to complete a LDD structure. In the prior art, photolithography is used to form a LDD structure, so that it is difficult to control positions of the order of 1 μm or less. However, with the interconnect according to the present invention, the film thickness of the copper conductive layer 20 can be utilized to control positions. It is thus possible to control positions of the order of 0.1 μm to realize a fine pattern. Further, the injected impurities are sufficiently activated by being annealed at 500° C.

Then, resist is coated using the PEP. Then, the gate insulator film 34 is etched to open the contact holes 36 up to the surface of the polysilicon film 33. Furthermore, the sputtering process, resist coating by using the PEP, and an etching process is executed to form the interconnects 37b and 37c, connected to a source and drain electrodes, respectively, having a two-layer structure composed of AlNd and Mo or the like. (see FIG. 10F). Subsequently, the source and drain electrodes are formed. The source and drain electrodes may be formed integrally with the interconnects 37b and 37c, respectively. Furthermore, the signal lines 58 can be formed integrally one of the source and drain electrodes.

The above steps are executed to form a MOS structure n type TFT. After the formation, the undercoat film 31 has a thickness of 150 nm and the amorphous silicon film 32 has a thickness of 50 nm. The gate insulator film 34 has a thickness of 135 nm and the gate electrode 35 has a thickness of 500 nm. The AlNd/Mo film for the interconnect 37 is 640/50 nm in thickness.

Therefore, the TFT 60 according to Embodiment 4 comprises the semiconductor layer 33 having the channel area 39a and the source area 39b and drain area 39c, provided at the respective sides of the channel area 39a, the gate insulator film 34, provided on the semiconductor layer 33, the gate electrode 35, provided on the gate insulator film 34 opposite the channel area 39a, the source electrode electrically connected to the source area 39b, and the drain electrode electrically connected to the drain area 39c. The gate electrode 35 comprises three layers, i.e., a barrier film for copper diffusion 14, a copper seed layer 18, and a copper conductive layer 30 is provided on, not buried in, the gate insulator film 34 (insulator base 13). The barrier film for copper diffusion 14 serves as a barrier film for metal diffusion. The layer 18 is provided on the film 14, thus functioning as a metal seed layer. The layer 30 is provided on the copper seed layer 18.

Owing to this specific structure of the gate electrode 35, an LDD structure can be formed as the gate electrode 35 is formed. Thus, no PEP process needs to be carried out to form the LDD structure. This reduces the manufacturing cost of the TFTs structure. The structure of the gate electrode 35 helps to position the LDD region with high precision, which achieves finer patterning of the TFTs structure.

Further, the gate electrode 35 can be selectively formed on the gate insulator film 34, without making a trench in the film 34 or forming another insulating film in addition to the film 34. Hence, materials can be saved in the manufacture of the interconnect structure. This also helps to reduce the manufacturing cost of the interconnect structure.

Further, the liquid crystal display device 51 according to Embodiment 4 comprises a plurality of TFTs arranged in matrix form. Each of these TFTs is the above described TFT 60. Accordingly, the gate electrode 35 can be selectively formed on the gate insulator film 34. Further, the material for the interconnect structure can be saved. Furthermore, it is possible to reduce the number of manufacturing steps and thus manufacturing costs.

The TFT 60 provided in the display device according to Embodiment 4 is not limited to the above described one. For example, the TFT 60 described in Embodiment 5 may be applied.

Embodiment 5

FIGS. 11A to 11F are sectional views showing the steps of a forming method for a MOS structure n type TFT according to Embodiment 5 of the present invention.

This embodiment includes exactly the same steps as those starting with the formation of the undercoat film 31 and amorphous silicon film 32 on the substrate 11, shown in FIG.

10A for Embodiment 4, described above, and ending with the formation of the gate insulator film 34, shown in FIG. 10C. Accordingly, the description of these steps is omitted.

Figure 11A:
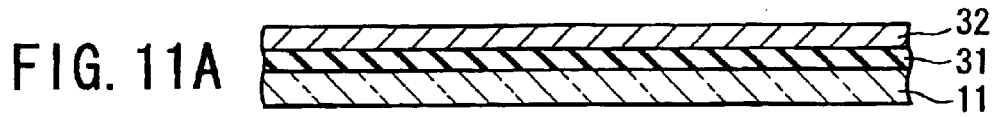
FIGS. 11A to 11F are sectional views showing the steps of a forming method for a MOS structure n type TFT provided in a display device according to Embodiment 5 of the present invention.
Figure 11B:
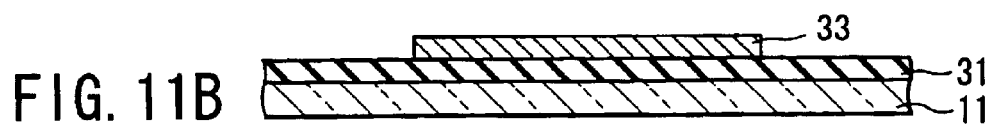
Figure 11C:
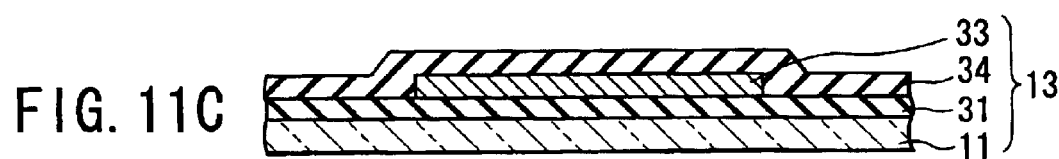
Figure 11D:
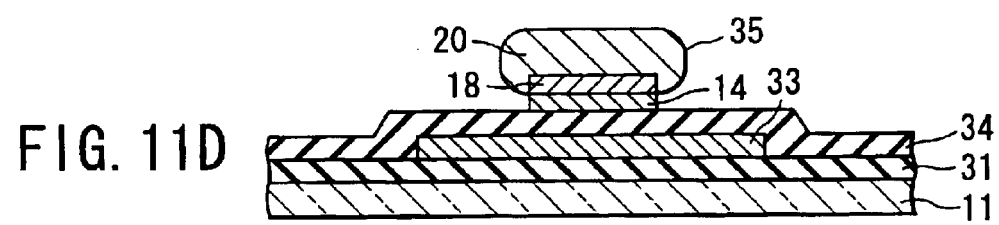

The gate insulator film 34 is formed (see FIG. 11C). Subsequently, the barrier film for copper diffusion 14 is formed. Furthermore, resist is coated using the PEP, and the copper seed layer 18 is selectively formed using the electroless plating process. Subsequently, the resist film is removed and the barrier film for copper diffusion 14 is etched using the copper seed layer 18 as a mask. Subsequently, the copper conductive layer 20 is selectively formed on the copper seed layer 18 using the electroplating process. The gate electrode 35 is thus formed by the same method as that shown in Embodiment 2 (see FIG. 11D).

Figure 11E:
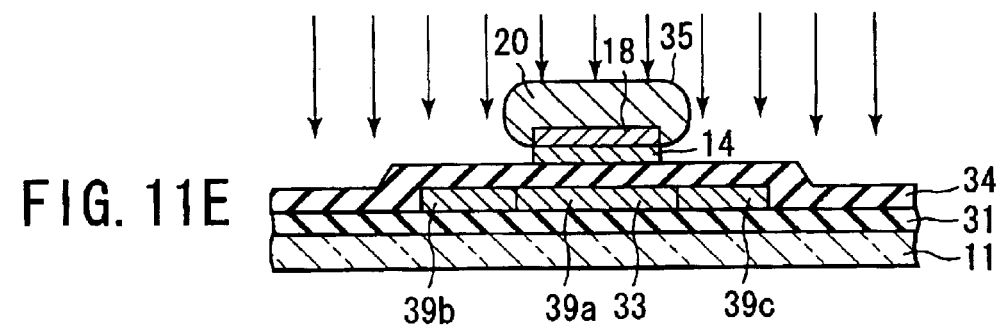
Figure 11F:
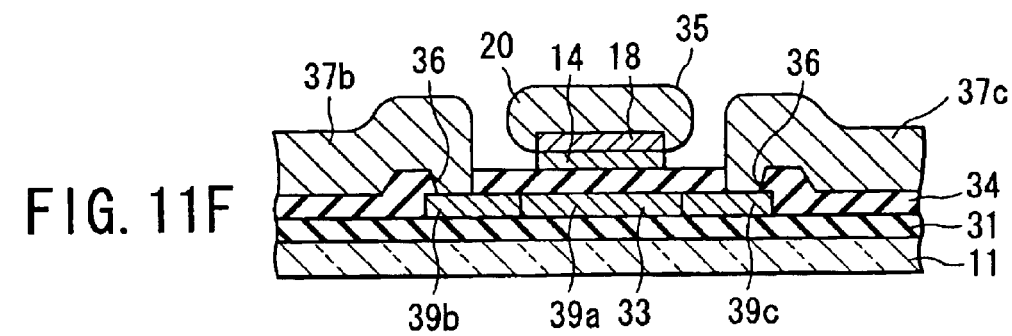

Subsequently, as shown in FIG. 11E, $PH_3$ is used as doping gas to inject phosphorous as donor into the polysilicon film 33 by the ion doping process (dose: $2.5 \times 10^{15}/cm^2$; acceleration voltage: 70 keV). At this time, the phosphorous is not injected into that part of the polysilicon film 33 which is immediately below that part of the side of the copper conductive layer 20 which projects from the side of the barrier film for copper diffusion 14. The impurities injected can be fully activated by annealing at 500° C. Thus, it suffices to perform the doping only once, successfully providing a structure that comprises the source region 39b, drain region 39c and high-resistance region.

In the present embodiment, doping is carried out only once, forming a structure by performing that can suppress the leakage current as much as the conventional structure that are formed by performing doping twice. With this embodiment it is possible to form the source region 39b, drain region 39c and high-resistance region at the same time. This reduces the number of steps of manufacturing the interconnect structure.

Then, as shown in FIG. 9F, resist is coated using the PEP. Then, the gate insulator film 34 is etched to open the contact holes 36 up to the surface of the polysilicon film 33. Furthermore, the sputtering process, resist coating by the PEP, and an etching process is executed to form the interconnects 37b and 37c, connected to a source and drain electrodes, respectively, having a two-layer structure composed of AlNd and Mo or the like.

The above steps are executed to form a MOS structure n type TFT. After the formation, the undercoat film 31 has a thickness of 150 nm and the amorphous silicon film 32 has a thickness of 50 nm. The gate insulator film 34 has a thickness of 135 nm and the gate electrode 35 has a thickness of 500 nm. The AlNd/Mo film for the interconnect 37 is 640/50 nm in thickness. Embodiment 5 can produce effects similar to those of Embodiment 4.

The present invention has been specifically described on the basis of Embodiments 1 to 5. However, the present invention is not limited to these embodiments. Of course, various changes may be made to these embodiments without departing from the spirits of the present invention. For example, in Embodiments 1 to 5, copper is used as a material for the interconnect. However, the present invention is not limited to this aspect but is applicable to interconnects made of alloys containing copper or other metals.

This invention is applied to the gate electrode 35 of the TFT 60 of top-gate type, forming an LDD structure or a structure achieving the same advantage as an LDD structure, at a desired position with high precision. Additionally, the no PEP process needs to be carried out to form the LDD structure. Nonetheless, this invention is not limited to the gate electrode 35 of the TFT 60 of top-gate type. Rather, the invention may be applied to the source electrode, drain electrode, interconnects 37b and 37c connected to the source and drain electrodes, respectively, scan line 57, and signal line 58. The source electrode, drain electrode, interconnects 37b and 37c, scan line 57, and signal line 58 may be formed of three layers, i.e., a barrier film for metal diffusion, a metal seed layer provided on the barrier film for metal diffusion, and a metal conductive layer provided on the metal seed layer. Thus, the interconnects, or interconnect structure, can be selectively formed on the substrate. Further, the manufacturing cost of the interconnects decreases since materials are saved and the number of manufacturing steps is reduced.

Further, the present invention is not limited to liquid crystal display devices but is applicable to display devices such as organic Light Emitting Diode devices or inorganic electro luminescence devices.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An interconnect forming method comprising:
   a step of forming a barrier film for metal diffusion on an insulator base;
   a step of selectively forming a metal seed layer on the barrier film for metal diffusion using an electroless plating process; and
   a step of selectively forming a metal conductive layer on the metal seed layer using an electroplating process.

2. An interconnect forming method comprising:
   a step of forming a barrier film for metal diffusion on an insulator base;
   a step of selectively forming a metal seed layer on the barrier film for metal diffusion using an electroless plating process;
   a step of selectively forming a metal conductive layer on the metal seed layer using an electroplating process; and
   a step of etching the barrier film for metal diffusion using the metal conductive layer as a mask.

3. An interconnect forming method comprising:
   a step of forming a barrier film for metal diffusion on an insulator base;
   a step of selectively forming a metal seed layer on the barrier film for metal diffusion using an electroless plating process;
   a step of etching the barrier film for metal diffusion using the metal seed layer as a mask; and
   a step of selectively forming a metal conductive layer on the metal seed layer using an electroplating process.

4. The interconnect forming method according to claim 1, wherein the insulator base has a substrate and an underlying insulator film provided on the substrate.

5. An interconnect forming method comprising:
   a step of forming a barrier film for metal diffusion on an insulator base;
   a step of selectively forming a metal seed layer on the barrier film for metal diffusion; and
   a step of selectively forming a metal conductive layer on the metal seed layer using an electroplating process,
   further comprising a step of carrying out annealing after the metal seed layer has been formed to reduce film stress that may occur in the metal seed layer.

6. An interconnect forming method comprising:

a step of forming a barrier film for metal diffusion on an insulator base;

a step of selectively forming a metal seed layer on the barrier film for metal diffusion; and a step of selectively forming a metal conductive layer on the metal seed layer using an electroplating process, wherein the step of selectively forming the metal seed layer on the barrier film for metal diffusion using the electroless plating process uses a mask composed of a photosensitive resin and having a trench shaped so as to correspond to an area in which the metal seed layer is formed, to execute the electroless plating process to form the metal seed layer on the barrier film for metal diffusion exposed from this trench.

7. The interconnect forming method according to claim 2, wherein the insulator base has a substrate and an underlying insulator film provided on the substrate.

8. The interconnect forming method according to claim 2, further comprising a step of carrying out annealing after the metal seed layer has been formed to reduce film stress that may occur in the metal seed layer.

9. The interconnect forming method according to claim 2, wherein the step of selectively forming the metal seed layer on the barrier film for metal diffusion using the electroless plating process uses a mask composed of a photosensitive resin and having a trench shaped so as to correspond to an area in which the metal seed layer is formed, to execute the electroless plating process to form the metal seed layer on the barrier film for metal diffusion exposed from this trench.

10. The interconnect forming method according to claims 3, wherein the insulator base has a substrate and an underlying insulator film provided on the substrate.

11. The interconnect forming method according to claim 3, further comprising a step of carrying out annealing after the metal seed layer has been formed to reduce film stress that may occur in the metal seed layer.

12. The interconnect forming method according to claim 3, wherein the step of selectively forming the metal seed layer on the barrier film for metal diffusion using the electroless plating process uses a mask composed of a photosensitive resin and having a trench shaped so as to correspond to an area in which the metal seed layer is formed, to execute the electroless plating process to form the metal seed layer on the barrier film for metal diffusion exposed from this trench.

* * * * *